US006353194B1

(12) United States Patent
Rychlak

(10) Patent No.: US 6,353,194 B1
(45) Date of Patent: Mar. 5, 2002

(54) ELECTRICAL DEVICE WITH DISPLAY AND SWITCH ARRANGEMENT

(75) Inventor: Stefan Rychlak, Ilsede (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/485,375

(22) PCT Filed: Jul. 17, 1998

(86) PCT No.: PCT/DE98/02005

§ 371 Date: Feb. 8, 2000

§ 102(e) Date: Feb. 8, 2000

(87) PCT Pub. No.: WO99/08344

PCT Pub. Date: Feb. 18, 1999

(30) Foreign Application Priority Data

Aug. 12, 1997 (DE) .......................................... 197 34 859

(51) Int. Cl.[7] .......................... H01H 9/00; H05K 11/00; H04B 1/40

(52) U.S. Cl. ....................... 200/5 A; 200/317; 361/679; 455/344

(58) Field of Search ......................... 200/5 A, 512–517, 200/308–317, 302.1–302.3; 361/679–681, 682–834; 455/344–350; 381/86

(56) References Cited

U.S. PATENT DOCUMENTS

| | | | | | |
|---|---|---|---|---|---|
| 4,683,360 | A | * | 7/1987 | Maser | 200/314 |
| 4,789,224 | A | | 12/1988 | Bougsty | 349/65 |
| 4,896,370 | A | * | 1/1990 | Kasparian et al. | |
| 4,940,414 | A | | 7/1990 | Lee | 439/131 |
| 5,510,782 | A | * | 4/1996 | Norris et al. | 200/314 |
| 5,521,342 | A | * | 5/1996 | Bartley et al. | 200/314 |
| 5,739,486 | A | * | 4/1998 | Buckingham | 200/310 X |
| 5,747,756 | A | * | 5/1998 | Boedecker | 200/314 |

FOREIGN PATENT DOCUMENTS

| | | |
|---|---|---|
| DE | 35 12 229 | 10/1986 |
| DE | 42 36 353 | 5/1994 |

* cited by examiner

*Primary Examiner*—J. R. Scott
(74) *Attorney, Agent, or Firm*—Kenyon & Kenyon

(57) ABSTRACT

An electrical device, in particular a car radio, which requires less manufacturing outlay. The electrical device includes a display device and operating control elements. A transparent panel is provided, in front of which is arranged the display device. The panel has a contact strip with connection contacts for the display device. Arranged on the panel are contact surfaces, which are able to be contacted via the operating control elements. The contact strip has connection contacts for the contact surfaces.

8 Claims, 4 Drawing Sheets

ELECTRICAL DEVICE WITH DISPLAY AND SWITCH ARRANGEMENT

BACKGROUND OF THE INVENTION

Electrical devices, such as car radios, which have a display device and operating control elements, are generally known.

SUMMARY OF THE INVENTION

An advantage of the electrical device of the present invention is that the panel for mounting the display device is provided at the same time with contact surfaces that are able to be contacted via the operating control elements. This enhances the functionality of the panel, so that there is no need for a circuit board for contacting the contact surfaces via the operating control elements in the device's case front. In this manner, one economizes on space, material and costs.

Also advantageous is the fact that the contact strip having connection contacts for the display device also has connection contacts for the contact surfaces. This enables the connection contacts for the display device and for the contact surfaces to be manufactured in one single sequence of operation. Moreover, the connection contacts for the display device, and the connection contacts for the contact surfaces can be contacted via one single contact film by corresponding mating contacts on a main board, so that one can economize on additional contact films and, consequently, on material, space, and costs.

It is beneficial that the operating control elements are designed as buttons, that a switch (control) pad is provided between the buttons and the contact surfaces, that the switch pad has contacts which are assigned to the buttons, and that, in response to actuation of one of the buttons, its assigned contact makes contact with two contact surfaces. Using switch pads to convert a button actuation into the contacting of two contact surfaces, substantially simplifies and accelerates the assembly of the electrical device, since one merely needs to insert the particular intended switch pad between the buttons and the contact surfaces. Moreover, using a switch pad having contacts assigned to the buttons for contacting two contact surfaces, renders possible an especially reliable contacting, in which no loose contacts occur.

It is also beneficial that the switch pad is made, at least partially, of transparent material. This enables the operating control elements to be illuminated via the switch pad.

A further advantage lies in the fact that the display device and the operating control elements can be illuminated by one common light source. This is facilitated mostly because both the display device and the contact surfaces for the operating control elements are arranged on one shared panel, so that one light source, which illuminates the panel, can illuminate both the display device and the operating control elements located in front of the contact surfaces. This makes it possible to economize on light sources when illuminating the display device and the operating control elements.

A further advantage lies in the fact that the panel is able to be illuminated by the light source via a reflector. This improves panel illumination, and makes illumination possible through suitable reflector position and form, independently of the light source's mounting location.

Another advantage lies in the fact that the connection contacts of the contact strip are electroconductively connected via a contact film to corresponding mating contacts of a main board. This improves and simplifies the arrangement of the connection between the contact strip and the main board, since the contact film can be connected, for example, via a suitable plug-contact arrangement, to the mating contacts of the main board, eliminating the need for individually connecting the single connection contacts.

Also beneficial is the fact that the operating control elements are at least partially made of transparent material. This allows them to be illuminated by a light source arranged behind the panel, so that operation in the dark is simplified for the user.

DETAILED DESCRIPTION

Figure 1:
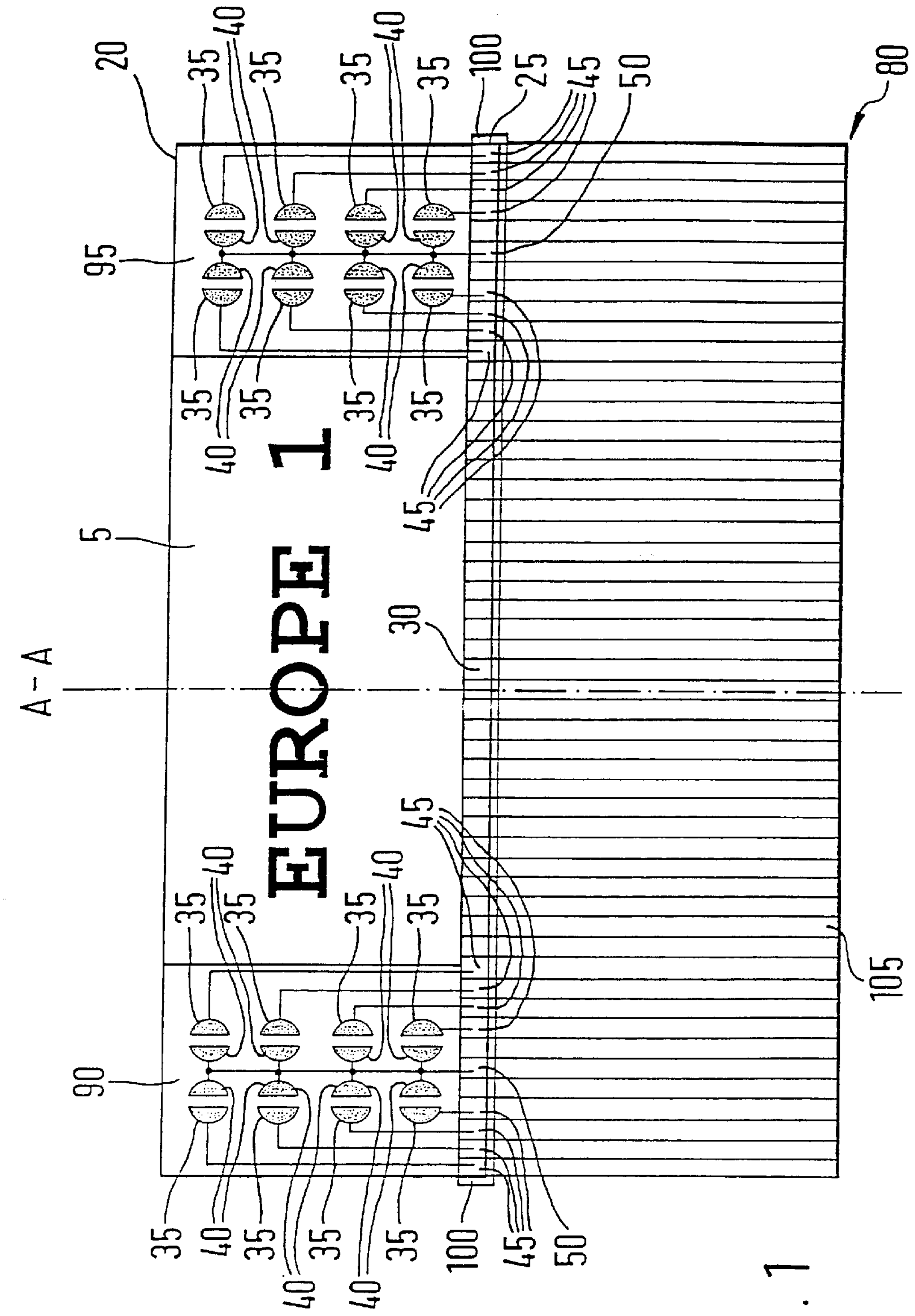
FIG. 1 depicts a transparent panel having a display device and contact surfaces, as well as a contact film.
Figure 2:
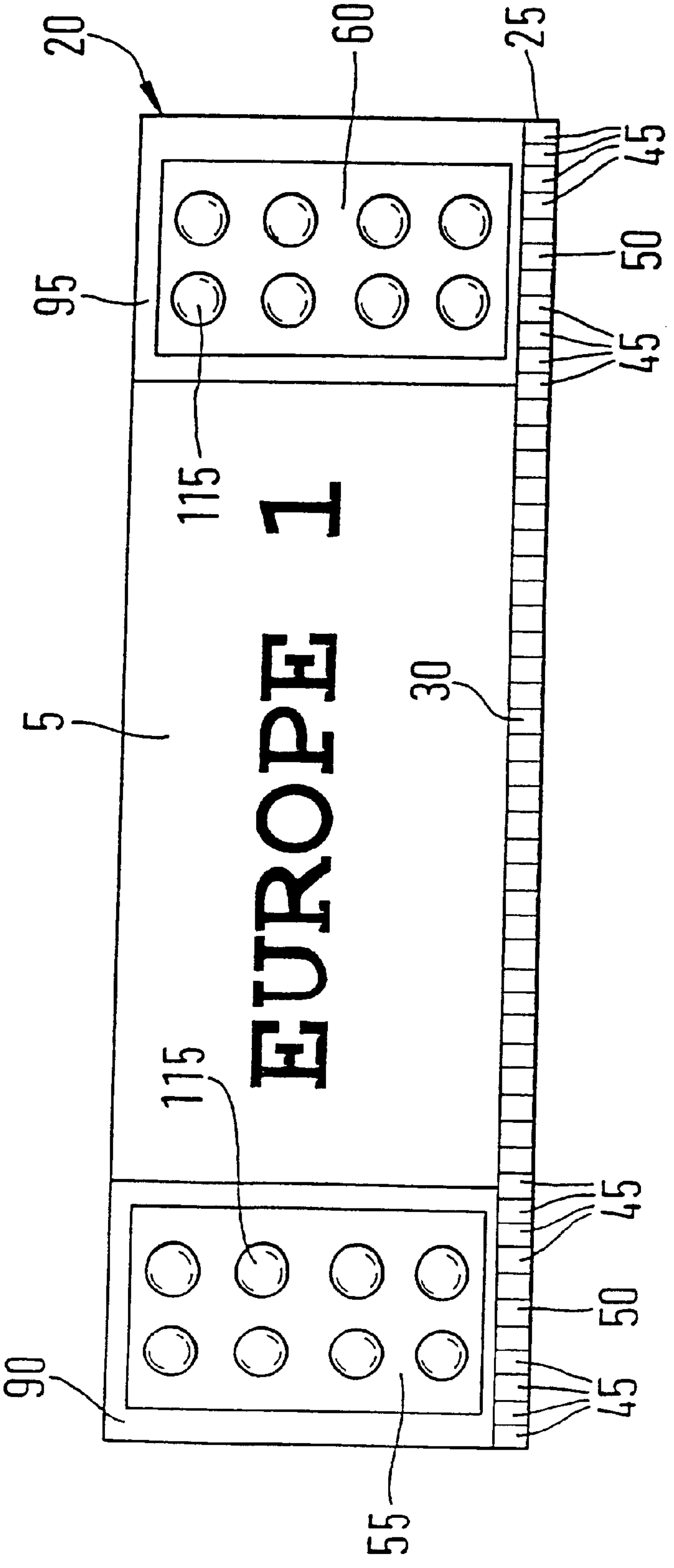
FIG. 2 illustrates a transparent panel having a display device and switch pads.
Figure 4:
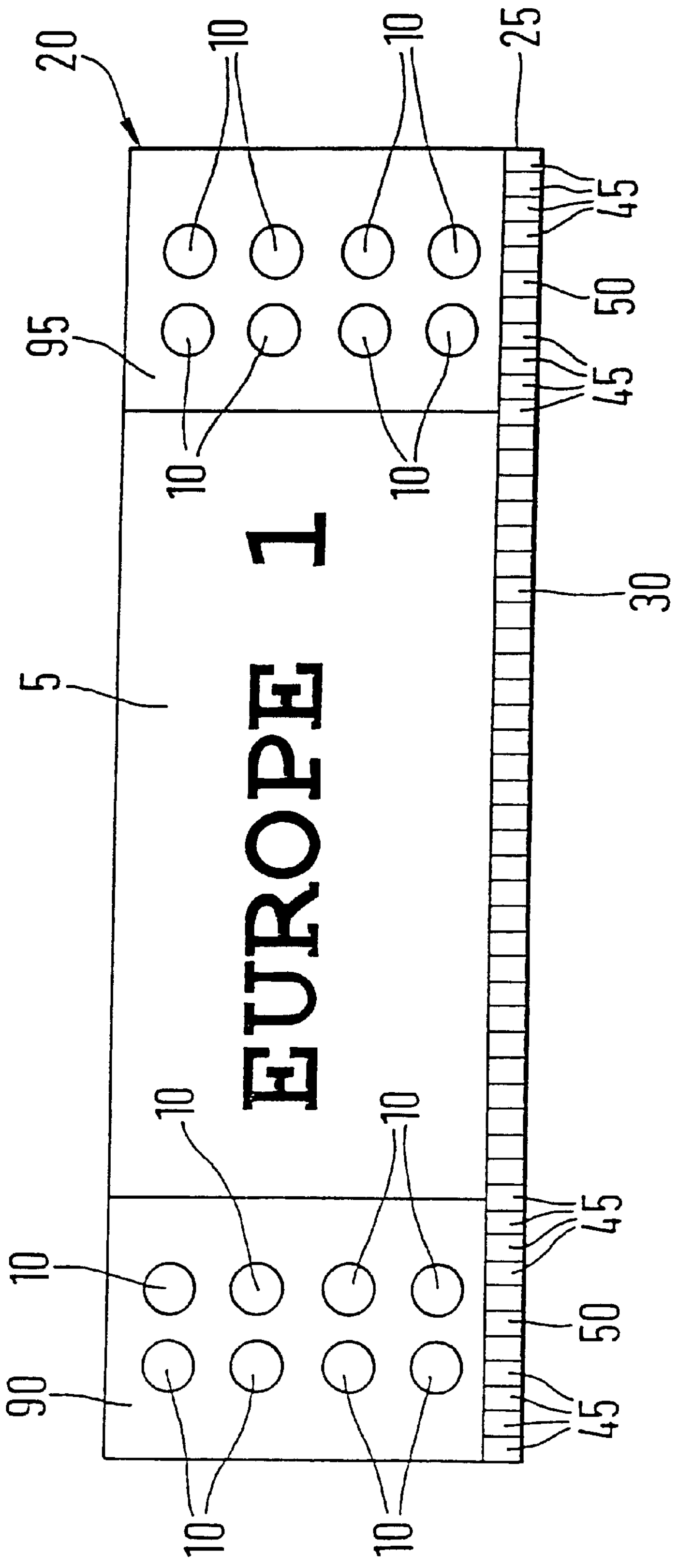
FIG. 4 shows a panel including a display device and operating control elements.

In FIG. 1, there is a panel 20 which is transparent, for example, a glass or plexiglass panel. The panel 20 is arranged in an electrical device 1, which is shown in a lateral sectional view in FIG. 5, the section running along a line of intersection A—A according to FIG. 1, more or less centrically perpendicularly to the longitudinal edges of rectangular-shaped panel 20. Electrical device 1 shown in this exemplary embodiment is a car radio. According to FIG. 5, a display device 5, designed, for example, as a liquid crystal display, is arranged on the side of panel 20 facing away from the inner part of the device. In accordance with FIG. 1, the information "Europe 1" appears on display device 5, and can represent, for example, the name of a radio broadcast being received at the moment. To the left and right of display device 5, from the user's perspective, in accordance with FIG. 1, a first region 90 and a second region 95 are provided on panel 20, first region 90 being disposed to the left and second region 95 to the right of display device 5 on panel 20. Arranged on each of the two regions 90, 95 of panel 20, on the side of panel 20 facing display device 5, are eight metallic contact surface pairs 35, 40, which can be placed on panel 20, for example, by vapor deposition. Each contact surface pair 35, 40 is made up of a first contact surface 35 and a second contact surface 40, first contact surface 35 and second contact surface 40 being galvanically separated from one another. Nevertheless, first contact surface 35 and second contact surface 40 of each contact surface pair 35, 40 are adjacent to one another, and are spaced apart by a relatively small distance on corresponding region 90, 95 of panel 20. Below first region 90, second region 95 and display device 5, panel 20 has a contact strip 25 with connection contacts 30 for display device 5, and connection contacts 45, 50 for contact surfaces 35, 40. In this context, connection contacts 30, 45, 50 are likewise metallic and applied, for example, by vapor deposition to contact strip 25 of panel 20. Connection contacts 30 for display device 5 are arranged below display device 5 on contact strip 25. However, for reasons of clarity, only one of these connection contacts 30 for display device 5 is illustrated in FIGS. 1, 2 and 4. Connection contacts 45, 50 for contact surfaces 35, 40 are arranged below first region 90 and second region 95 on contact strip 25 of panel 20. Each first contact surface 35 of contact surface pairs 35, 40 is provided with it own single connection contact 45, which is electroconductively connected to the corresponding first contact surface 35, for example, by a printed conductor vapor-deposited on panel 20. For each region 90, 95, provision is made at second contact surfaces 40 of contact surface pairs 35, 40, for a single connection contact 50 which is electroconductively connected, for example, through printed conductors vapor-deposited on panel 20, to second contact surfaces 40 of each region 90, 95. Second contact surfaces 40 of each region 90, 95 are, therefore, not galvanically separated from one another, and they have the same potential. This can be a reference potential, for example. However, provision can also be made for each of second contact surfaces 40 to have its own connection contact on contact strip 25. Contact strip 25 having connection contacts 30, 45, 50 is inserted into a plug-contact arrangement 100 of a contact film 80, contact film 80 having connecting leads 105, only one of which is shown in FIG. 1 for the sake of simplicity, with connecting leads 105 electroconductively connecting connection contacts 30, 45, 50 to corresponding mating contacts on a main board 85 in car radio 1. In so doing, contact film 80 is inserted into a plug-contact arrangement 110 of main board 85 in order to make contact with the mating contacts in main board 85.

In FIG. 2, equivalent elements are denoted by equivalent reference numerals. On the side of panel 20, facing display device 5, a first switch pad 55 is arranged on first region 90, and a second switch pad 60 on second region 95, both of which cover contact surface pairs 35, 40 on both regions 90, 95. At the location of contact surface pairs 35, 40, switch pads 55, 60 have so-called switch domes 115 that curve away as spherical, concave domes from panel 20, toward the user. In this context, switch pads 55, 60 are made of elastic material, for examples of rubber. Switch domes 115 can thus be pressed in toward panel 20, so that they each make contact with their corresponding, assigned contact surface pair 35, 40.

Figure 3:
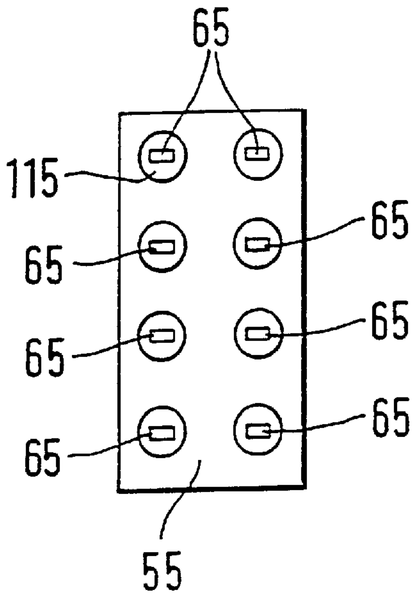
FIG. 3 shows a rear view of a switch pad.

FIG. 3 shows a rear view of first switch pad 55, which also corresponds, however, to the rear view of second switch pad 60 and which depicts the side of corresponding switch pads 55, 60 facing panel 20. In this context, on their side facing panel 20, switch domes 115 each have a metallic contact 65, whose dimensions are selected so that when the particular switch dome 115 is pressed in, in the direction of panel 20, both contact surfaces 35, 40 of contact surface pair 35, 40 assigned to the respective switch dome 115 are electroconductively connected to one another via contact 65. This enables one to adjust an operational function of car radio 1 or an operational value, such as the volume.

Switch pads 55, 60 are made of transparent material, at least in the region of switch domes 115. However, switch pads 55, 60 can also be made completely out of transparent material.

In FIG. 4, equivalent elements are denoted by equivalent reference numerals. In this context, operating control elements 10, designed as buttons, are arranged on an instrument front of car radio 1, in first region 90 and in second region 95 of panel 20, on the side of switch pads 55, 60 facing away from panel 20. Each button 10 has an assigned switch dome 115, so that each of buttons 10 is arranged directly above its corresponding switch dome 115. Actuation of buttons 10 depresses the respective underlying switch dome 115 in such a way that the two contact surfaces 35, 40 of the assigned contact surface pair 35, 40 are contacted via corresponding contact 65, and the appropriately selected operational function, i.e., the appropriately selected functional value, is adjusted. In this case, buttons 10 can likewise be made of transparent material. In response to the user releasing button-10, the corresponding switch dome 115, due to its elasticity and form, moves away again from panel 20, toward the user, again bringing to an end the contacting of the two corresponding contact surfaces 35, 40 via contact 65.

Figure 5:
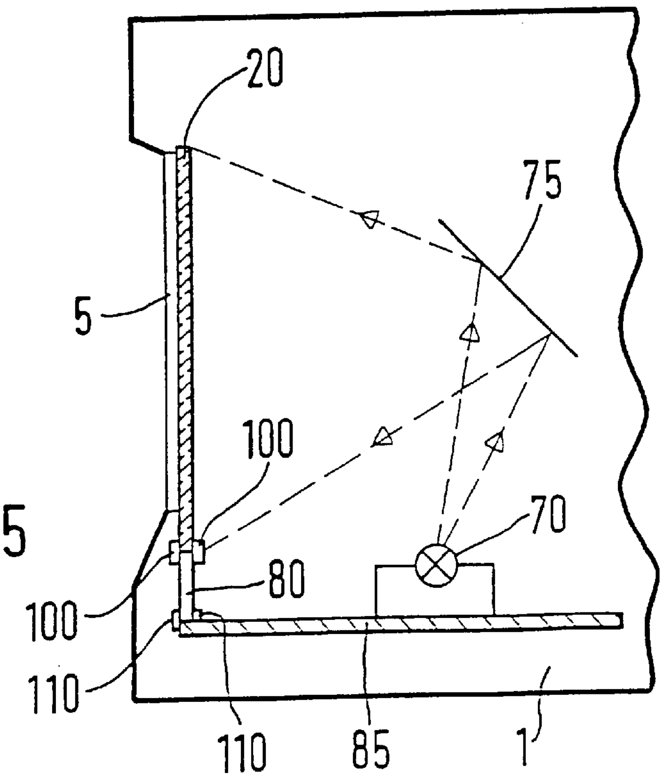
FIG. 5 shows a section through an electrical device according to the present invention.

The sectional view in accordance with FIG. 5 reveals that, arranged inside car radio 1, on main board 84, is a light source 70, which radiates light onto a reflector 75, reflector 75 reflecting the light emitted by light source 70 onto panel 20, illuminating the entire panel 20. If switch pads 55, 60 and buttons 10 are at least partially made of transparent material, display device 5, as well as buttons 10 can be simultaneously illuminated via light source 70 and reflector 75. This is especially beneficial for the user in the darkness. Due to the use of a reflector 75, one is comparatively free to select any mounting location for light source 70 in car radio 1, given an appropriate alignment and form of reflector 75. On the other hand, if no reflector 75 is provided in car radio 1, then one is more restricted in varying the mounting location for light source 70 in car radio 1, behind panel 20, for illuminating entire panel 20.

The present invention is not limited to car radio 1. In general, it can be applied to any electrical device 1 that has a display device 5 and operating control elements 10. These can include, for example, a compact disc player, a cassette player, a washing machine, a telephone terminal, a mobile phone, etc.

Operating control elements 10 can also be designed as pushbuttons, switches or the like. For the design of operating control elements 10, it is merely necessary that actuation of the same will permit the corresponding switch domes 115 to be depressed toward panel 20, for both corresponding contact surfaces 35, 40 to be contacted via corresponding contact 65.

It is not absolutely necessary for entire panel 20 to be illuminated. It suffices if the locations of display device 5 and operating control elements 10 on panel 20 are illuminated.

All of operating control elements 10 can either be partially or completely made of transparent material. However, it is also possible for at least one operating control element 10 to be made of opaque material. The same applies to switch domes 115 of switch pads 55, 60, and to the switch pads 55, 60 themselves.

What is claimed is:

1. An electrical device comprising:

a transparent panel;

a display device situated in front of the transparent panel, the transparent panel having a contact strip with first connection contacts for the display device;

contact surfaces situated on the transparent panel, the contact strip having second connection contacts for the contact surfaces; and operating control elements for contacting the contact surfaces.

2. The electrical device according to claim 1, wherein the electrical device is a car radio.

3. The electrical device according to claim 1, wherein the operating control elements include buttons, and further comprising at least one switch pad situated between the buttons and the contact surfaces, the switch pad having contacts associated with the buttons, and wherein, in response to an actuation of one of the buttons, an associated one of the contacts makes contact with two of the contact surfaces.

4. The electrical device according to claim 3, wherein the switch pad is composed, at least partially, of a transparent material.

5. The electrical device according to claim 1, further comprising a common light source for illuminating the display device and the operating control elements.

6. The electrical device according to claim 5, further comprising a reflector, the light source illuminating the transparent panel via the reflector.

7. The electrical device according to claim 1, further comprising a contact film and a main board, the first and second connection contacts of the contact strip being electroconductively connected via the contact film to corresponding mating contacts of the main board.

8. The electrical device according to claim 1, wherein the operating control elements are composed, at least partially, of a transparent material.

* * * * *